(12) United States Patent
Tan et al.

(10) Patent No.: US 12,408,283 B2
(45) Date of Patent: Sep. 2, 2025

(54) COVER PLATE AND DISPLAY SCREEN

(71) Applicant: WUHAN CHINA STAR OPTOELECTRONICS SEMICONDUCTOR DISPLAY TECHNOLOGY CO., LTD., Wuhan (CN)

(72) Inventors: Min Tan, Wuhan (CN); Dongdong Zhang, Wuhan (CN); Kun Pan, Wuhan (CN); Chuanhe Jing, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 18/267,658

(22) PCT Filed: May 31, 2023

(86) PCT No.: PCT/CN2023/097588
§ 371 (c)(1),
(2) Date: Jun. 15, 2023

(87) PCT Pub. No.: WO2024/239365
PCT Pub. Date: Nov. 28, 2024

(65) Prior Publication Data
US 2024/0397651 A1 Nov. 28, 2024

(30) Foreign Application Priority Data
May 23, 2023 (CN) .......................... 202310587204.9

(51) Int. Cl.
*H05K 5/03* (2006.01)
*G06F 1/16* (2006.01)
*H10F 30/10* (2025.01)

(52) U.S. Cl.
CPC ............. *H05K 5/03* (2013.01); *G06F 1/1601* (2013.01); *H10F 30/10* (2025.01); *G06F 1/1603* (2013.01); *G06F 1/1632* (2013.01); *G06F 1/1637* (2013.01)

(58) Field of Classification Search
CPC .... G06F 1/1601; G06F 1/1603; G06F 1/1632; G06F 1/1637; H05K 5/03; H10F 30/10
See application file for complete search history.

(56) References Cited

U.S. PATENT DOCUMENTS 9,832,868 B1 * 11/2017 Wright .................... G06F 3/041
11,493,382 B1    11/2022 Almanza-Workman et al.
(Continued)

FOREIGN PATENT DOCUMENTS

CN    102967362 A    3/2013
CN    103927051 A    7/2014
(Continued)

OTHER PUBLICATIONS

Korean Office Action issued in corresponding Korean Patent Application No. 10-2023-7041031 dated Oct. 31, 2024, pp. 1-11, 25pp.
(Continued)

*Primary Examiner* — Mark R Gaworecki
(74) *Attorney, Agent, or Firm* — The Roy Gross Law Firm, LLC; Roy Gross

(57) ABSTRACT

The present application discloses a cover plate and a display screen, the cover plate includes a cover plate body, an ink portion, and a barrier portion. The cover plate body includes a display region and a frame region. The frame region surrounds the display region, and an infrared sensing hole sub-region is disposed on the frame region. The ink portion is disposed on a surface of the cover plate body and is located in the frame region. The ink portion includes a white ink layer covering infrared sensing hole sub-region. The (Continued)

barrier portion is disposed in the frame region and is located on a side of the infrared sensing hole sub-region away from display region.

20 Claims, 8 Drawing Sheets

(56) References Cited

U.S. PATENT DOCUMENTS

| | | | |
|---|---|---|---|
| 2016/0054175 A1 | 2/2016 | Jia et al. | |
| 2017/0184764 A1* | 6/2017 | Matsuyuki | G02B 5/208 |
| 2017/0364172 A1* | 12/2017 | Kim | G06F 1/1686 |
| 2023/0071744 A1 | 3/2023 | Wang | |

FOREIGN PATENT DOCUMENTS

| | | |
|---|---|---|
| CN | 111833721 A | 10/2020 |
| CN | 111965871 A | 11/2020 |
| CN | 112349866 A | 2/2021 |
| CN | 113140688 A | 7/2021 |
| CN | 116133459 A | 5/2023 |
| JP | 2002268040 A | 9/2002 |
| KR | 20130105110 A | 9/2013 |
| KR | 20190072134 A | 6/2019 |
| KR | 20200063188 A | 6/2020 |

OTHER PUBLICATIONS

PCT International Search Report for International application No. PCT/CN2023/097588, mailed on Jan. 29, 2024, 11pp.
PCT Written Opinion of the International Searching Authority for International application No. PCT/CN2023/097588, mailed on Jan. 29, 2024, 7pp.

* cited by examiner

COVER PLATE AND DISPLAY SCREEN

CROSS REFERENCE TO RELATED APPLICATIONS

This application is a National Phase of PCT Patent Application No. PCT/CN2023/097588 having International filing date of May 31, 2023, which claims the benefit of priority of Chinese Patent Application No. 202310587204.9, filed May 23, 2023, the contents of which are all incorporated herein by reference in their entirety.

FIELD OF INVENTION

The present application relates to a field of display technologies, especially to a cover plate and a display screen.

BACKGROUND OF INVENTION

In recent years, with the increasing demand for eye protection and energy-saving by consumers, in order to meet this demand, traditional technical solutions adjust the brightness of the apparatus screen by measuring the distance between the user's apparatus and their facial features, as well as the ambient light brightness, using an infrared sensor. This is done to achieve the goal of eye protection and energy-saving.

The display screen of a traditional user apparatus has an infrared sensing hole, which is gradually located near an edge of a cover plate. The infrared sensing hole is coated with white ink, which shields visible light but allows infrared light to pass through. Due to the fluidity of ink, there may be certain tolerances in the printing process that cause white ink to overflow onto the edge of the display panel cover plate, changing the path of light reflection and refraction, resulting in a glowing phenomenon near the position of the infrared sensing hole corresponding to the edge of the cover plate.

SUMMARY OF INVENTION

Technical Issue

An embodiment of the present application provides a cover plate and a display screen that can solve an issue of a glowing edge of a cover plate.

Technical Solution

In one aspect, the embodiment of the present application provides a cover plate, comprising: a cover plate body comprising a display region and a frame region surrounding the display region, wherein an infrared sensing hole sub-region is disposed in the frame region; an ink portion disposed on a surface of the cover plate body, located in the frame region, and comprising a white ink layer covering the infrared sensing hole sub-region; and a barrier portion disposed in the frame region and located on a side of the infrared sensing hole sub-region away from the display region; wherein a boundary of the white ink layer away from the display region does not extend beyond a boundary of the barrier portion away from display region.

Optionally, in some embodiments of the present application, the ink portion further comprises a first black ink layer and a translucent black ink layer, and the first black ink layer is disposed in the frame region and surrounds the infrared sensing hole sub-region; and the translucent black ink layer is disposed in the frame region and covers the infrared sensing hole sub-region, and the white ink layer covers the translucent black ink layer.

Optionally, in some embodiments of the present application, the barrier portion comprises a barrier recess disposed in the frame region and located on a side of the infrared sensing hole sub-region away from the display region.

Optionally, in some embodiments of the present application, the infrared sensing hole sub-region and the barrier recess are arranged along a first direction, a cross-sectional width of the barrier recess along a second direction is greater than a cross-sectional width of the white ink layer along the second direction, and the first direction is perpendicular to the second direction.

Optionally, in some embodiments of the present application, a depth of the barrier recess is greater than or equal to a thickness of the ink portion.

Optionally, in some embodiments of the present application, the barrier portion comprises a barrier column disposed in the frame region and located on a side of the infrared sensing hole sub-region away from the display region.

Optionally, in some embodiments of the present application, the infrared sensing hole sub-region and the barrier column are arranged along a first direction, a cross-sectional width of the barrier column along a second direction is greater than a cross-sectional width of the white ink layer along the second direction, and the first direction is perpendicular to the second direction.

Optionally, in some embodiments of the present application, a height of the barrier column is greater than or equal to a thickness of the ink portion.

Optionally, in some embodiments of the present application, he barrier portion comprises a barrier recess and a barrier column, and the barrier column is disposed adjacent to the barrier recess.

Optionally, in some embodiments of the present application, the infrared sensing hole sub-region, the barrier recess, and the barrier column are arranged along a first direction, a cross-sectional width of at least one of the barrier recess and the barrier column along a second direction is greater than a cross-sectional width of the white ink layer along the second direction, and the first direction is perpendicular to the second direction.

Optionally, in some embodiments of the present application, a depth of the barrier recess is greater than or equal to a thickness of the ink portion; or a height of the barrier column is greater than or equal to a thickness of the ink portion.

Optionally, in some embodiments of the present application, the barrier portion comprises at least two barrier recesses, and/or, the barrier portion comprises at least two barrier columns.

Optionally, in some embodiments of the present application, cross-sectional widths of the at least two barrier recesses along the second direction are unequal; and/or cross-sectional widths of at least two of the barrier columns along the second direction are unequal.

Optionally, in some embodiments of the present application, heights of the at least two barrier recesses along a thickness direction of the cover plate body are unequal; and/or heights of at least two of the barrier columns along the cover plate body thickness direction are unequal.

Optionally, in some embodiments of the present application, the ink portion further comprises a second black ink layer disposed on a side of the first black ink layer away from the cover plate body; a first through hole is defined in the first black ink layer corresponding to the infrared sensing hole sub-region; a second through hole is defined in the second black ink layer corresponding to the infrared sensing hole sub-region, the translucent black ink layer covers surfaces of the first through hole and the second through hole and partially covers the second black ink layer; and a cross-sectional width of the first through hole along a first direction is greater than or equal to a cross-sectional width of the second through hole along the first direction.

In another aspect, the embodiment of the present application also provides a display screen comprising a cover plate and a display panel, wherein the cover plate is bonded to a light exiting surface of the display panel and comprises: a cover plate body comprising a display region and a frame region, the frame region surrounds the display region, and an infrared sensing hole sub-region is defined in the frame region; an ink portion disposed on a surface of the cover plate body, located in the frame region, and comprising a white ink layer covering the infrared sensing hole sub-region; and a barrier portion disposed in the frame region and located on a side of the infrared sensing hole sub-region away from the display region; wherein a boundary of the white ink layer away from the display region does not extend beyond a boundary of the barrier portion away from display region.

Optionally, in some embodiments of the present application, the ink portion further comprises a first black ink layer and a translucent black ink layer, and the first black ink layer is disposed in the frame region and surrounds the infrared sensing hole sub-region; and the translucent black ink layer is disposed in the frame region and covers the infrared sensing hole sub-region, and the white ink layer covers the translucent black ink layer.

Optionally, in some embodiments of the present application, the barrier portion comprises a barrier recess or a barrier column, and the barrier portion is disposed in the frame region and is located on a side of the infrared sensing hole sub-region away from the display region.

Optionally, in some embodiments of the present application, the infrared sensing hole sub-region and the barrier portion are arranged along a first direction, a cross-sectional width of the barrier portion along a second direction is greater than a cross-sectional width of the white ink layer along the second direction, and the first direction is perpendicular to the second direction.

Advantages

An embodiment of the present application provides a cover plate and a display screen, the cover plate comprises: a cover plate body, an ink portion and a barrier portion. The cover plate body comprises a display region and a frame region. The frame region is disposed to surround the display region, and an infrared sensing hole sub-region is defined in the frame region. The ink portion is disposed in the frame region and comprises a white ink layer covering the infrared sensing hole sub-region. The barrier portion is disposed in the frame region and is located on a side of the infrared sensing hole sub-region away from the display region. By such configuration, disposing the barrier portion between edges of the ink portion and the cover plate prevents the white ink on an edge of the infrared sensing hole from overflowing to the edge of the cover plate, which can solve an issue of the glowing edge of the cover plate to improve a display effect.

DETAILED DESCRIPTION OF PREFERRED EMBODIMENTS

The following will describe the technical solution in the embodiment of the present application, in conjunction with the attached drawings in the embodiment of the present application. The described embodiment is only used to explain and illustrate the idea of the present application and should not be construed as limiting the protection range of the present application.

An embodiment of the present application provides a display screen, comprising a cover plate and a display panel. The cover plate is bonded to a light exiting surface of the display panel. The display panel comprises an infrared sensor.

Figure 1:
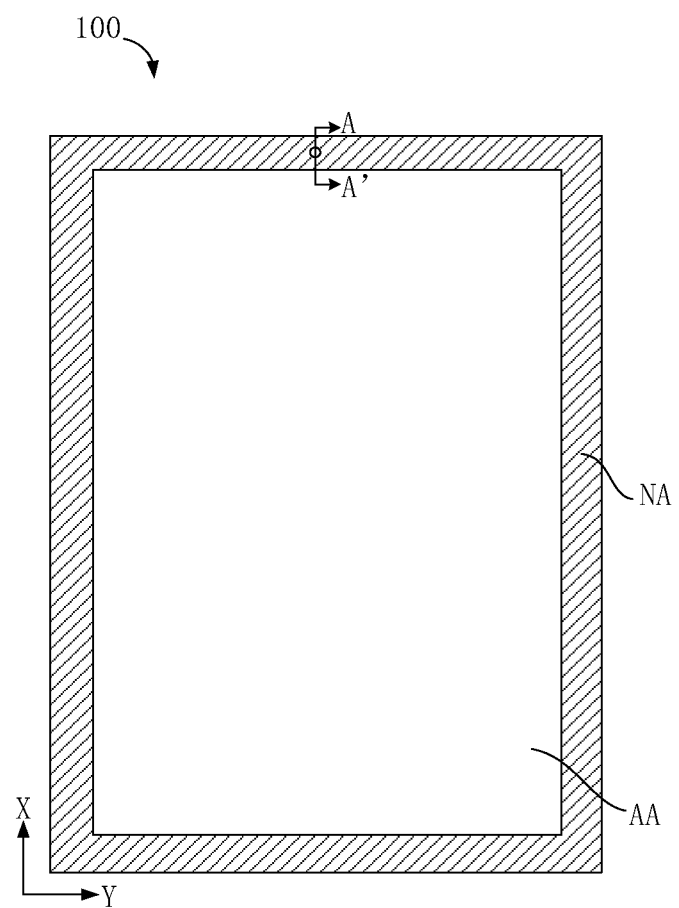
FIG. 1 is a top view of a cover plate provided by the embodiment of the present application.
Figure 2A:
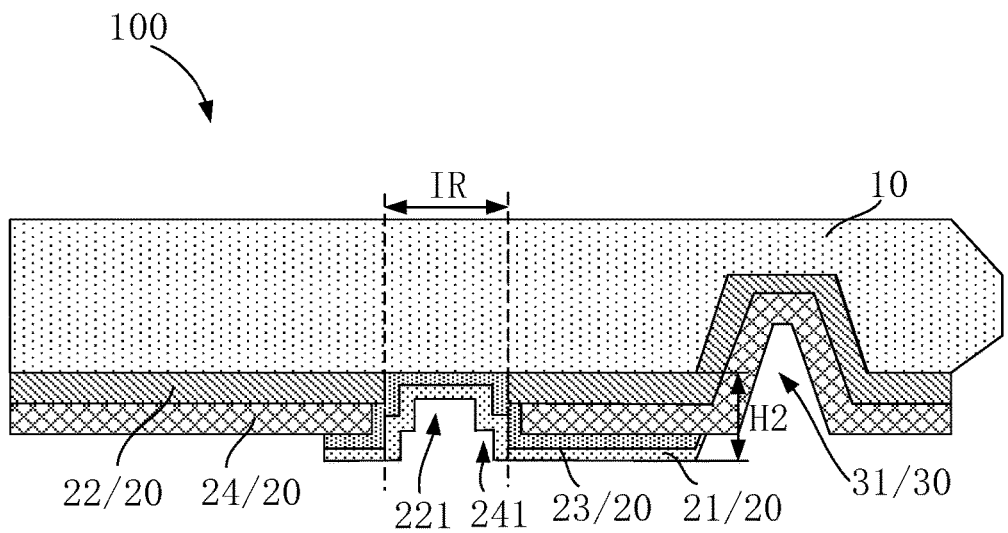
FIG. 2a is a first cross-sectional view of the cover plate in FIG. 1 along an AA' line.
Figure 2B:
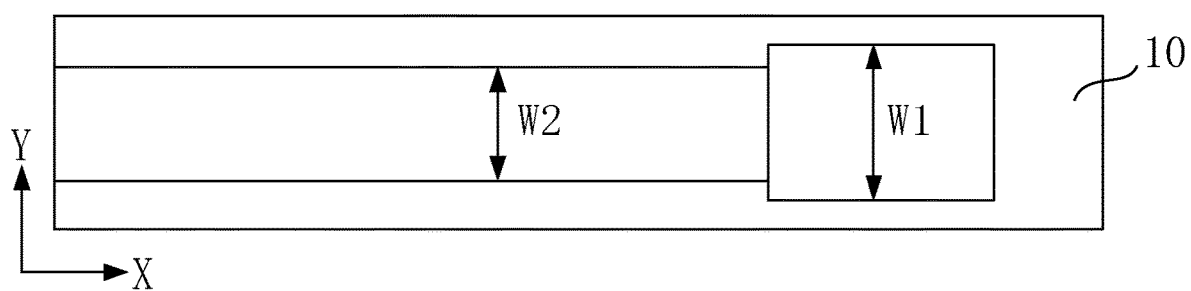
FIG. 2b is a first top view of the cover plate in FIG. 1 along the AA' line.

With reference to FIGS. 1 to 2b, FIG. 1 is a top view of a cover plate provided by the embodiment of the present application; FIG. 2a is a first cross-sectional view of the cover plate in FIG. 1 along an AA' line; and FIG. 2b is a first top view of the cover plate in FIG. 1 along the AA' line. With reference to FIG. 1 and FIG. 2a, the embodiment of the present application provides a cover plate 100 comprising: a cover plate body 10, an ink portion 20 and a barrier portion 30. The cover plate body 10 comprises a display region AA and a frame region NA. The frame region NA is disposed to surround the display region AA, and an infrared sensing hole sub-region IR is disposed in the frame region NA. An infrared sensor is disposed in the infrared sensing hole sub-region IR. The ink portion 20 is disposed on a surface of the cover plate body 10 away from a light emitting side and is located in the frame region NA. The ink portion 20 comprises a white ink layer 21, the white ink layer 21 covers the infrared sensing hole sub-region IR. The barrier portion 30 is disposed on the frame region NA and is located on a side of the infrared sensing hole sub-region IR away from the display region AA. A boundary of the white ink layer 21 away from the display region AA does not extend beyond a boundary of the barrier portion 30 away from the display region AA.

In the embodiment of the present application, disposing the barrier portion 30 between edges of the ink portion 20 and cover plate prevents the white ink on an edge of the infrared sensing hole from overflowing an edge of a cover plate, which can avoid change of refractive and reflection paths of light to further avoid glowing of the edge of the cover plate.

In the embodiment of the present application, the ink portion 20 further comprises a first black ink layer 22 and a translucent black ink layer 23. The first black ink layer 22 is disposed in the frame region NA and surrounds the infrared sensing hole sub-region IR. The translucent black ink layer 23 is disposed in the frame region NA and covers the infrared sensing hole sub-region IR. The white ink layer 21 covers the translucent black ink layer 23. In particular, ink portion is disposed on a surface of the cover plate body 10 away from the light emitting side.

In particular, the translucent black ink layer 23 is configured to shield the bottom portion structure and visible light. The white ink layer 21 is configured to make light passing through the infrared sensing hole sub-region IR become even white light. The first black ink layer 22, the translucent black ink layer 23 and the white ink layer 21 all comprise resin, hardener, auxiliary, and solvent. The resin is an ink main body structure, hardener is configured to ensure cross-linking degree and printing performance of the resin. The auxiliary and solvent are configured to ensure printing performance of the ink. The first black ink layer 22, the translucent black ink layer 23, and the white ink layer 21 all further comprise pigments. The pigment is configured to adjust a color of the ink. A pigment of the first black ink layer 22 is black, a pigment of the translucent black ink layer 23 is gray, and a pigment of the white ink layer 21 is white.

In the embodiment of the present application, a first ink region 201, a the first through hole 221 and a second ink region 202 are arranged along a first direction X. A cross-sectional width of the barrier portion 30 along a second direction Y is greater than a cross-sectional width of the ink portion 20 along the second direction Y. The first direction X is perpendicular to the second direction Y. Preferably, a cross-sectional width of the barrier portion 30 along the second direction Y is greater than the white ink layer 21 along a cross-sectional width of the second direction Y. The first direction X means a length direction of the display panel, and the second direction Y means a width direction of the display panel.

Furthermore, a height of the barrier portion 30 along a thickness direction of the cover plate body 10 is greater than or equal to the thickness of the ink portion 20. Preferably, with reference to FIG. 2a, a height H1 of the barrier portion 30 along the thickness direction of the cover plate body 10 is greater than a thickness of the ink portion 20 H2. Such configuration advantages blocking the excessive white ink in the edge of the cover plate during silkscreen printing to prevent the white ink from overflowing to the edge of the cover plate, leading to change of refractive and reflection paths of light, and resulting in reflective light of the white ink more than that of a normal product to cause glowing of the edge of the cover plate.

In the embodiment of the present application, the ink portion 20 further comprises a second black ink layer 24. The second black ink layer 24 is disposed on a side of the first black ink layer 22 away from the cover plate body 10. A first through hole 221 is defined in the first black ink layer 22 corresponding to the infrared sensing hole sub-region IR. A second through hole 241 is defined in the second black ink layer 24 corresponding to the infrared sensing hole sub-region IR. The translucent black ink layer 23 covers surfaces of the first through hole 221 and the second through hole 241 and partially covers the second black ink layer 24. In particular, the translucent black ink layer 23 covers bottom surfaces of the first through hole 221 and the second through hole 241, are disposed along two sidewalls of the first direction X, and extends from the sidewalls to partially cover the second black ink layer 24. A cross-sectional width of the first through hole 221 along the first direction X is greater than or equal to a cross-sectional width of the second through hole 241 along the first direction X.

In particular, material of the first black ink layer 22 and the second black ink layer 24 comprises black ink or dark ink. The first black ink layer 22 and the second black ink layer 24 can be a single layer structure or a multi-layer structure. Namely, the first black ink layer 22 can only comprise one film layer, and can comprise at least two stacked film layers. Correspondingly, the second black ink layer 24 can only comprise one film layer, and can comprise at least two stacked film layers. The first through hole 221 and the second through hole 241 are infrared sensing holes. The translucent black ink layer 23 and the white ink layer 21 cover a surface of the infrared sensing hole, are configured to shield visible light and allow infrared to pass. Material of the second black ink layer 24 is the same as material of the first black ink layer 22.

In the embodiment of the present application, the barrier portion 30 comprises a barrier recess 31, the barrier recess 31 is disposed in the frame region NA and is located on a side of the infrared sensing hole sub-region IR away from the display region AA. With reference to FIG. 2b, a cross-sectional width W1 of the barrier recess 31 along the second direction Y is greater than the cross-sectional width W2 of white ink layer 21 along the second direction Y. With reference to FIG. 2a, a depth of the barrier recess 31 along the thickness direction of the cover plate body 10 is greater than the thickness of the ink portion 20. Such configuration advantages blocking the excessive white ink in the edge of the cover plate during silkscreen printing to prevent the white ink from overflowing to the edge of the cover plate, leading to change of refractive and reflection paths of light, and resulting in reflective light of the white ink more than that of a normal product to cause glowing of the edge of the cover plate. FIG. 2b, for example, only illustrates a size relationship of the cross-sectional width W1 of the barrier recess 31 along the second direction Y and the cross-sectional width W2 of white ink layer 21 along the second direction Y and would not limit a formation of the barrier recess 31 along the thickness direction of the display panel.

Figure 3:
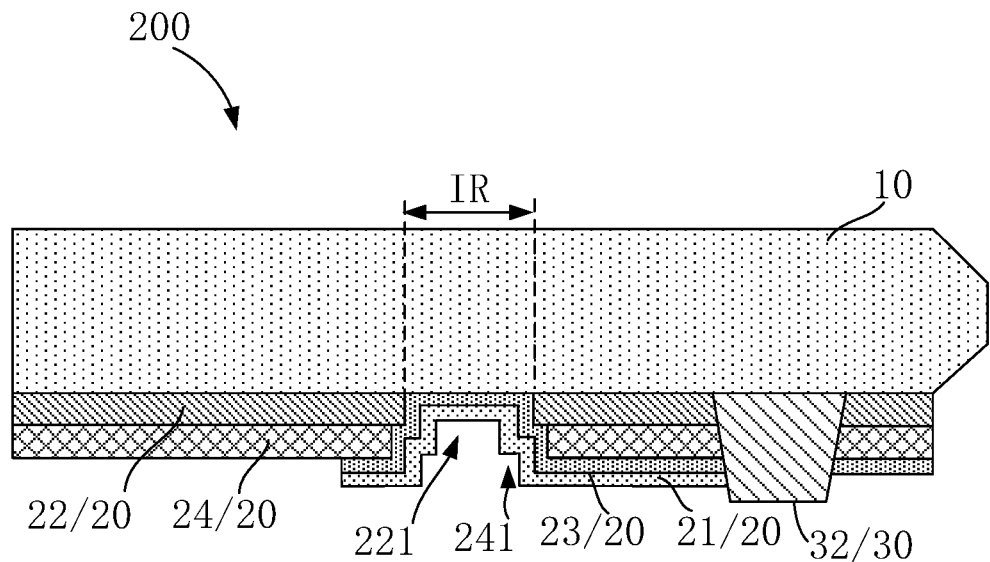
FIG. 3 is a second cross-sectional view of the cover plate in FIG. 1 along the AA' line.

As a specific embodiment of the present application, with reference to FIG. 3, FIG. 3 is a second cross-sectional view of the cover plate in FIG. 1 along the AA' line. With reference to FIG. 3, the embodiment of the present application provides a cover plate 200, and a difference of the cover plate 200 from the cover plate 100 is that: the barrier portion 30 comprises a barrier column 32, and the barrier column 32 is disposed in the frame region NA and is located on a side of the infrared sensing hole sub-region IR away from the display region AA.

In the embodiment of the present application, the barrier column 32 is disposed on the surface of the cover plate body 10 away from the light emitting side, and a cross-sectional shape of the barrier column 32 along a thickness direction of the cover plate body 10 can be a trapezoidal structure such as isosceles trapezoid, and right angle trapezoid. A shape of the barrier column 32 comprises but is not limited to rectangular prism, cylinder, conical frustum, and hemisphere.

In the embodiment of the present application, a silkscreen printing process is used to form the first black ink layer 22, the second ink layer 24, the translucent black ink layer 23, and the white ink layer 21 on the cover plate body 10. Also, the barrier column 32 is formed on a side of the infrared sensing hole sub-region IR away from the display region AA by multi-printing the first black ink layer 22 or the second black ink layer 24. Namely, material of the barrier column 32 is the same as material of the first black ink layer 22 or the second black ink layer 24.

The cover plate 200 further comprises a cover plate body 10, an ink portion 20 and a barrier portion 30. The cover plate body 10 comprises a display region AA and a frame region NA. The frame region NA surrounds the display region AA, and an infrared sensing hole sub-region IR is disposed in the frame region. The ink portion 20 is disposed on a surface of the cover plate body 10 away from the light emitting side and is located in the frame region NA. The ink portion 20 comprises a white ink layer 21. The white ink layer 21 covers the infrared sensing hole sub-region IR. The barrier portion 30 is disposed in the frame region NA and is located on a side of the infrared sensing hole sub-region IR away from the display region AA.

In the embodiment of the present application, the ink portion 20 further comprises a first black ink layer 22 and a translucent black ink layer 23. The first black ink layer 22 is disposed in the frame region NA and surrounds the infrared sensing hole sub-region IR. The translucent black ink layer 23 is disposed in the frame region NA and covers the infrared sensing hole sub-region IR. The white ink layer 21 covers the translucent black ink layer 23. The second black ink layer 24 is disposed on a side of the first black ink layer 22 away from the cover plate body 10. A first through hole 221 is defined in the first black ink layer 22 corresponding to the infrared sensing hole sub-region IR. A second through hole 241 is defined in the second black ink layer 24 corresponding to the infrared sensing hole sub-region IR. The translucent black ink layer 23 covers surfaces of the first through hole 221 and the second through hole 241 and partially covers the second black ink layer 24. In particular, the translucent black ink layer 23 covers bottom surfaces of the first through hole 221 and the second through hole 241, are disposed along two sidewalls of the first direction X, and extends from the sidewalls to partially cover the second black ink layer 24. A cross-sectional width of the first through hole 221 along the first direction X is greater than or equal to a cross-sectional width of the second through hole 241 along the first direction X.

In the embodiment of the present application, the infrared sensing hole sub-region IR and the barrier column 32 are arranged along the first direction X. A cross-sectional width of the barrier column 32 along the second direction Y is greater than a cross-sectional width of the white ink layer 21 along the second direction Y. The first direction X is perpendicular to the second direction Y. Furthermore, a height of the barrier column 32 along a thickness direction of the cover plate body 10 is greater than or equal to a thickness of the ink portion 20. Preferably, the height of the barrier column 32 along the thickness direction of the cover plate body 10 is greater than the thickness of the ink portion 20. Such configuration advantages blocking the excessive white ink in the edge of the cover plate during silkscreen printing to prevent the white ink from overflowing to the edge of the cover plate, leading to change of refractive and reflection paths of light, and resulting in reflective light of the white ink more than that of a normal product to cause glowing of the edge of the cover plate.

Figure 4:
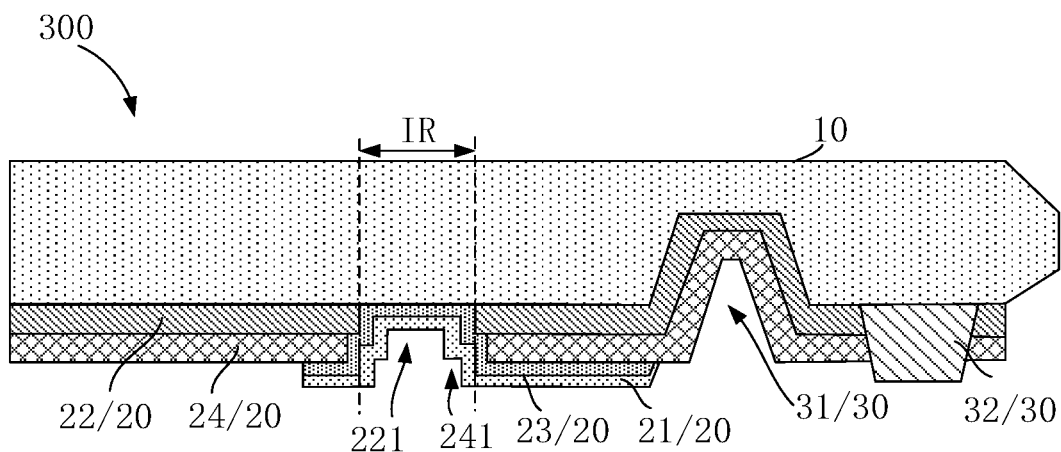
FIG. 4 is a third cross-sectional view of the cover plate in FIG. 1 along the AA' line.

As a specific embodiment of the present application, with reference to FIG. 4, FIG. 4 is a third cross-sectional view of the cover plate in FIG. 1 along the AA' line. With reference to FIG. 4, the embodiment of the present application provides a cover plate 300, and a difference of the cover plate 300 from the cover plate 100 is that: the barrier portion 30 comprises a barrier recess 31 and a barrier column 32, and the barrier recess 31 and the barrier column 32 are disposed adjacently.

In particular, the barrier recess 31 and the barrier column 32 can be disposed adjacently or be disposed at intervals. In FIG. 4, the barrier recess 31 and the barrier column 32 are disposed adjacently, and the barrier column 32 disposed on a side of the barrier recess 31 away from the second ink region 202 is taken as an example, in actual applications, the barrier recess 31 can also be on a side of the barrier column 32 away from the second ink region 202.

The cover plate 300 further comprises a cover plate body 10, an ink portion 20 and a barrier portion 30. The cover plate body 10 comprises a display region AA and a frame region NA. The frame region NA surrounds the display region AA, and an infrared sensing hole sub-region IR is disposed in the frame region. The ink portion 20 is disposed on a surface of the cover plate body 10 away from the light emitting side and is located in the frame region NA. The ink portion 20 comprises a white ink layer 21. The white ink layer 21 covers the infrared sensing hole sub-region IR. The barrier portion 30 is disposed in the frame region NA and is located on a side of the infrared sensing hole sub-region IR away from the display region AA.

In the embodiment of the present application, the ink portion 20 further comprises a first black ink layer 22 and a translucent black ink layer 23. The first black ink layer 22 is disposed in the frame region NA and surrounds the infrared sensing hole sub-region IR. The translucent black ink layer 23 is disposed in the frame region NA and covers the infrared sensing hole sub-region IR. The white ink layer 21 covers the translucent black ink layer 23. The second black ink layer 24 is disposed on a side of the first black ink layer 22 away from the cover plate body 10. A first through hole 221 is defined in the first black ink layer 22 corresponding to the infrared sensing hole sub-region IR. A second through hole 241 is defined in the second black ink layer 24 corresponding to the infrared sensing hole sub-region IR. The translucent black ink layer 23 covers surfaces of the first through hole 221 and the second through hole 241 and partially covers the second black ink layer 24. In particular, the translucent black ink layer 23 covers bottom surfaces of the first through hole 221 and the second through hole 241, are disposed along two sidewalls of the first direction X, and extends from the sidewalls to partially cover the second black ink layer 24. A cross-sectional width of the first through hole 221 along the first direction X is greater than or equal to a cross-sectional width of the second through hole 241 along the first direction X.

In the embodiment of the present application, the infrared sensing hole sub-region IR, the barrier recess 31 and the barrier column 32 are arranged along the first direction X. A cross-sectional width of at least one of the barrier recess 31 and the barrier column 32 along the second direction Y is greater than the cross-sectional width of white ink layer 21 along the second direction Y. Alternatively, a sum of cross-sectional widths of the barrier recess 31 and the barrier column 32, staggered along the first direction X, along the second direction Y is greater than the cross-sectional width of white ink layer 21 along the second direction Y. Furthermore, a height of at least one of the barrier recess 31 and the barrier column 32 along the thickness direction of the cover plate body 10 is greater than the thickness of the ink portion 20. Alternatively, a sum of heights of the barrier recess 31 and the barrier column 32 along the thickness direction of the cover plate body 10 is greater than the thickness of the ink portion 20. Preferably, the height of the barrier column 32 along the thickness direction of the cover plate body 10 is greater than the thickness of the ink portion 20. Such configuration advantages blocking the excessive white ink in the edge of the cover plate during silkscreen printing to prevent the white ink from overflowing to the edge of the cover plate, leading to change of refractive and reflection paths of light, and resulting in reflective light of the white ink more than that of a normal product to cause glowing of the edge of the cover plate.

Figure 5:
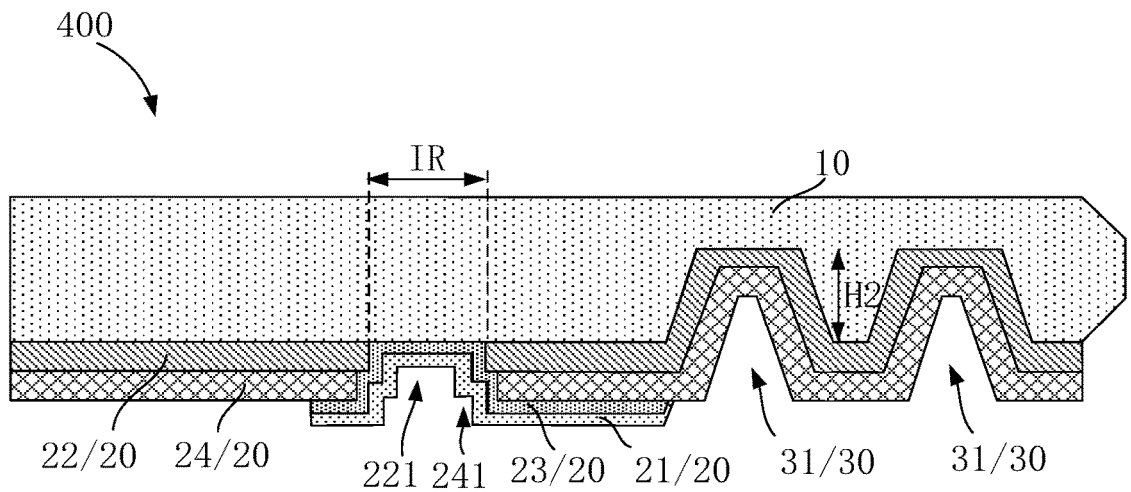
FIG. 5 is a fourth cross-sectional view of the cover plate in FIG. 1 along the AA' line.
Figure 6:
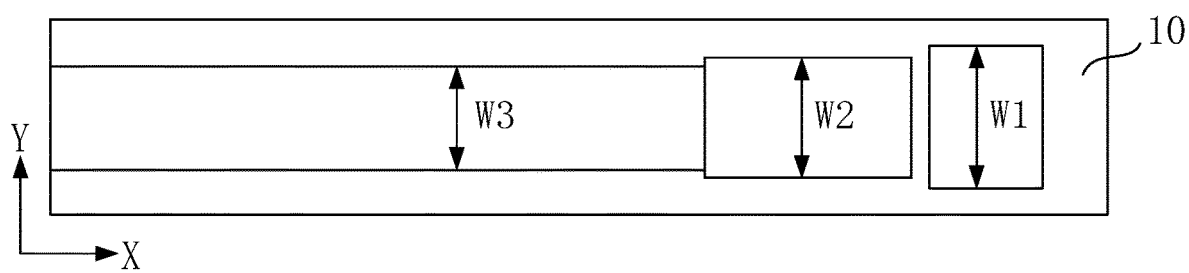
FIG. 6 is a fifth cross-sectional view of the cover plate in FIG. 1 along the AA' line.
Figure 7:
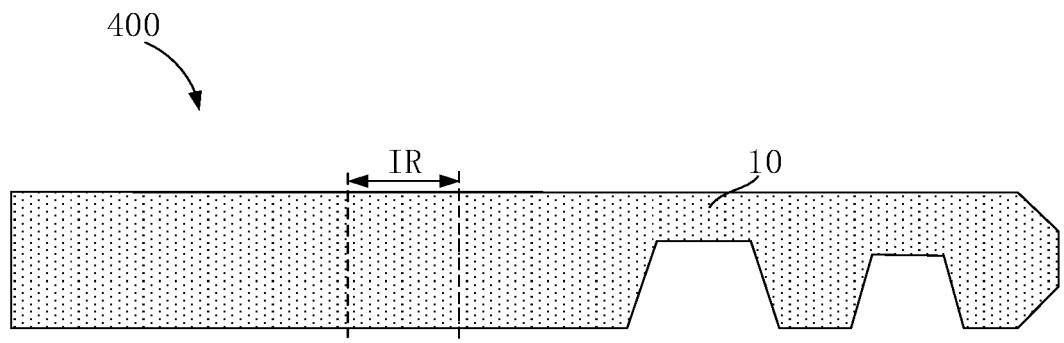
FIG. 7 is a sixth cross-sectional view of the cover plate in FIG. 1 along the AA' line.

As a specific embodiment of the present application, with reference to FIGS. 5 to 7, FIG. 5 is a fourth cross-sectional view of the cover plate in FIG. 1 along the AA' line; FIG. 6 is a fifth cross-sectional view of the cover plate in FIG. 1 along the AA' line; and FIG. 7 is a sixth cross-sectional view of the cover plate in FIG. 1 along the AA' line. With reference to FIG. 5, the embodiment of the present application provides a cover plate 400, and a difference of the cover plate 400 from the cover plate 100 is that: the barrier portion 30 comprises at least two barrier recesses 31, the at least two barrier recesses 31 are disposed at intervals in the frame region NA and are located on a side of the infrared sensing hole sub-region IR away from the display region AA. The barrier portion 30 in FIG. 5 comprises two barrier recesses 31.

In the embodiment of the present application, the cover plate 400 further comprises a cover plate body 10, an ink portion 20 and a barrier portion 30. The cover plate body 10 comprises a display region AA and a frame region NA. The frame region NA surrounds the display region AA, and an infrared sensing hole sub-region IR is disposed in the frame region. The ink portion 20 is disposed on a surface of the cover plate body 10 away from the light emitting side and is located in the frame region NA. The ink portion 20 comprises a white ink layer 21. The white ink layer 21 covers the infrared sensing hole sub-region IR. The barrier portion 30 is disposed in the frame region NA and is located on a side of the infrared sensing hole sub-region IR away from the display region AA.

In the embodiment of the present application, the ink portion 20 further comprises a first black ink layer 22 and a translucent black ink layer 23. The first black ink layer 22 is disposed in the frame region NA and surrounds the infrared sensing hole sub-region IR. The translucent black ink layer 23 is disposed in the frame region NA and covers the infrared sensing hole sub-region IR. The white ink layer 21 covers the translucent black ink layer 23. The second black ink layer 24 is disposed on a side of the first black ink layer 22 away from the cover plate body 10. A first through hole 221 is defined in the first black ink layer 22 corresponding to the infrared sensing hole sub-region IR. A second through hole 241 is defined in the second black ink layer 24 corresponding to the infrared sensing hole sub-region IR. The translucent black ink layer 23 covers surfaces of the first through hole 221 and the second through hole 241 and partially covers the second black ink layer 24. In particular, the translucent black ink layer 23 covers bottom surfaces of the first through hole 221 and the second through hole 241, are disposed along two sidewalls of the first direction X, and extends from the sidewalls to partially cover the second black ink layer 24. A cross-sectional width of the first through hole 221 along the first direction X is greater than or equal to a cross-sectional width of the second through hole 241 along the first direction X.

In the embodiment of the present application, the infrared sensing hole sub-region IR and two barrier recesses 31 are arranged along the first direction X, Preferably, with reference to FIG. 5, cross-sectional widths of two barrier recesses 31 along the second direction Y are equal, and depths of two barrier recesses 31 along the thickness direction of the cover plate body 10 are equal. Such configuration advantages blocking the excessive white ink in the edge of the cover plate during silkscreen printing to prevent the white ink from overflowing to the edge of the cover plate, leading to change of refractive and reflection paths of light, and resulting in reflective light of the white ink more than that of a normal product to cause glowing of the edge of the cover plate.

Furthermore, with reference to FIG. 6, the cross-sectional widths of the at least two barrier recesses 31 along the second direction Y are unequal. In particular, FIG. 6 takes two barrier recesses 31 for example, the cross-sectional width of at least one of the two barrier recesses 31 along the second direction Y is greater than a cross-sectional width of white ink layer 21 along the second direction Y. Alternatively, a sum of the cross-sectional widths of two barrier recesses 31 staggered along the first direction X along the second direction Y is greater than the cross-sectional width of white ink layer 21 along the second direction Y. In FIG. 6, a cross-sectional width W1 of the barrier recess 31 away from the second ink region 202 along the second direction Y is greater than the cross-sectional width W2 of the barrier recess 31 near the second ink region 202 along the second direction Y, the cross-sectional width W2 of the barrier recess 31 near the second ink region 202 along the second direction Y is greater than a cross-sectional width W3 of the white ink layer 21 along the second direction Y. FIG. 6, for example, only illustrates a size relationship of the cross-sectional width W1 of the barrier recess 31 along the second direction Y and the cross-sectional width W2 of the white ink layer 21 along the second direction Y and would not limit a formation of the barrier recess 31 along the thickness direction of the display panel.

Furthermore, with reference to FIG. 7, depths of the at least two barrier recesses 31 along the thickness direction of the cover plate body 10 are unequal. In particular, FIG. 7 takes two barrier recesses 31 for example, a depth of at least one of the two barrier recesses 31 along the thickness direction of the cover plate body 10 is greater than the thickness of the ink portion 20. Alternatively, a sum of the depths of the two barrier recesses 31 along the thickness direction of the cover plate body 10 is greater than the thickness of the ink portion 20.

Figure 8:
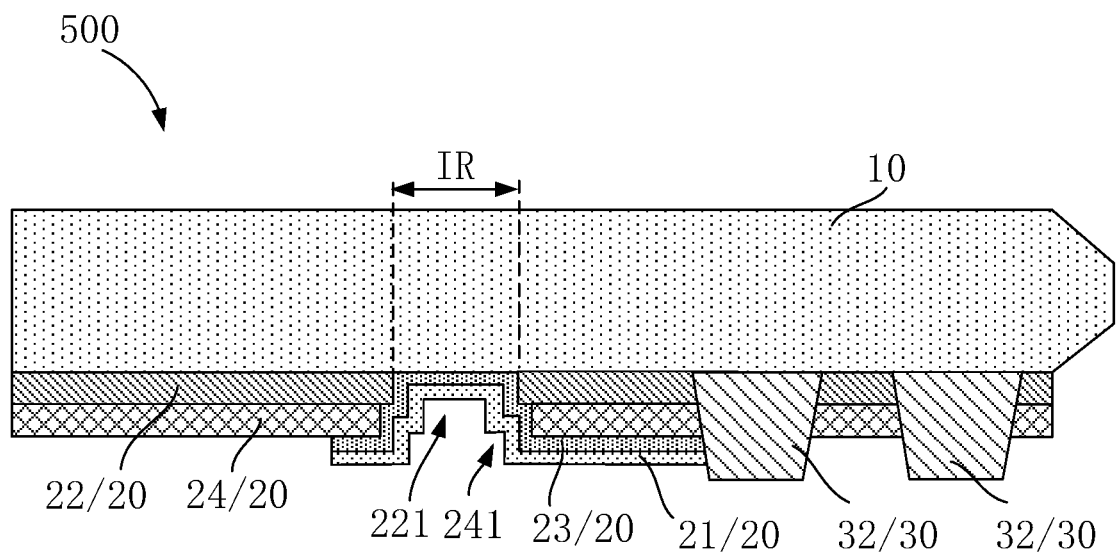
FIG. 8 is a seventh cross-sectional view of the cover plate in FIG. 1 along the AA' line.
Figure 9:
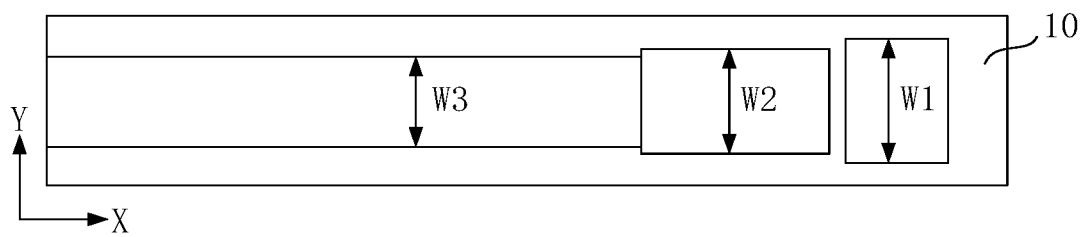
FIG. 9 is an eighth cross-sectional view of the cover plate in FIG. 1 along the AA' line.
Figure 10:
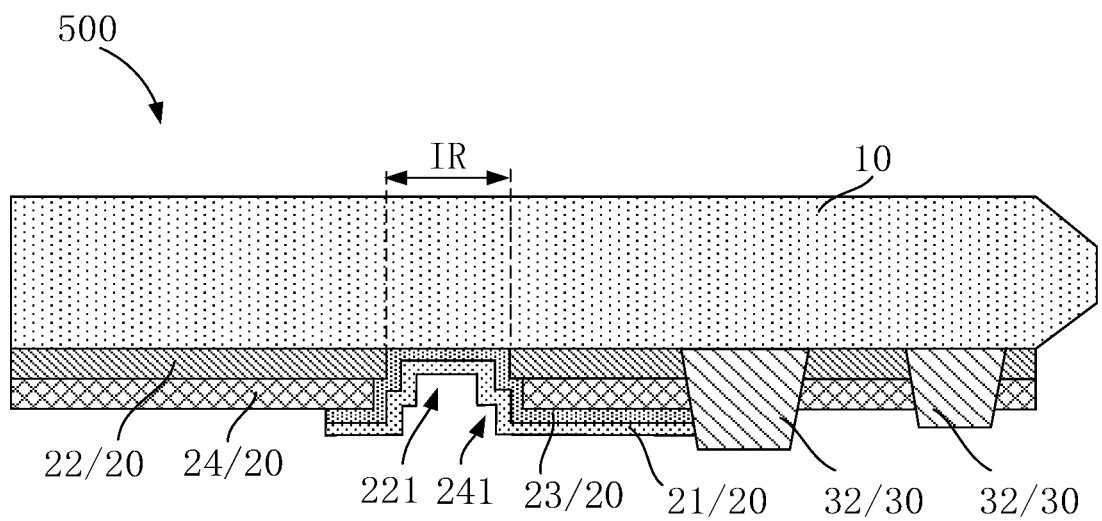
FIG. 10 is a ninth cross-sectional view of the cover plate in FIG. 1 along the AA' line.

As a specific embodiment of the present application, with reference to FIGS. 8 to 10, FIG. 8 is a seventh cross-sectional view of the cover plate in FIG. 1 along the AA' line; FIG. 9 is an eighth cross-sectional view of the cover plate in FIG. 1 along the AA' line; and FIG. 10 is a ninth cross-sectional view of the cover plate in FIG. 1 along the AA' line. With reference to FIG. 8, the embodiment of the present application provides a cover plate 500, and a difference of the cover plate 500 from the cover plate 100 is that: the barrier portion 30 comprises at least two barrier columns 32. The at least two barrier columns 32 are disposed at intervals in the frame region NA and are located on a side of the infrared sensing hole sub-region IR away from the display region AA.

In the embodiment of the present application, the cover plate 500 further comprises a cover plate body 10, an ink portion 20 and a barrier portion 30. The cover plate body 10 comprises a display region AA and a frame region NA. The frame region NA surrounds the display region AA, and an infrared sensing hole sub-region IR is disposed in the frame region. The ink portion 20 is disposed on a surface of the cover plate body 10 away from the light emitting side and is located in the frame region NA. The ink portion 20 comprises a white ink layer 21. The white ink layer 21 covers the infrared sensing hole sub-region IR. The barrier portion 30 is disposed in the frame region NA and is located on a side of the infrared sensing hole sub-region IR away from the display region AA.

In the embodiment of the present application, the ink portion 20 further comprises a first black ink layer 22 and a translucent black ink layer 23. The first black ink layer 22 is disposed in the frame region NA and surrounds the infrared sensing hole sub-region IR. The translucent black ink layer 23 is disposed in the frame region NA and covers the infrared sensing hole sub-region IR. The white ink layer 21 covers the translucent black ink layer 23. The second black ink layer 24 is disposed on a side of the first black ink layer 22 away from the cover plate body 10. A first through hole 221 is defined in the first black ink layer 22 corresponding to the infrared sensing hole sub-region IR. A second through hole 241 is defined in the second black ink layer 24 corresponding to the infrared sensing hole sub-region IR. The translucent black ink layer 23 covers surfaces of the first through hole 221 and the second through hole 241 and partially covers the second black ink layer 24. In particular, the translucent black ink layer 23 covers bottom surfaces of the first through hole 221 and the second through hole 241, are disposed along two sidewalls of the first direction X, and extends from the sidewalls to partially cover the second black ink layer 24. A cross-sectional width of the first through hole 221 along the first direction X is greater than or equal to a cross-sectional width of the second through hole 241 along the first direction X.

In the embodiment of the present application, the infrared sensing hole sub-region IR and two barrier columns 32 are arranged along the first direction X. Preferably, with reference to FIG. 8, cross-sectional widths of two barrier columns 32 along the second direction Y are equal, and heights of two barrier columns 32 along the thickness direction of the cover plate body 10 are equal. Such configuration advantages blocking the excessive white ink in the edge of the cover plate during silkscreen printing to prevent the white ink from overflowing to the edge of the cover plate, leading to change of refractive and reflection paths of light, and resulting in reflective light of the white ink more than that of a normal product to cause glowing of the edge of the cover plate.

Furthermore, with reference to FIG. 9, cross-sectional widths of at least two barrier columns 32 along the second direction Y are unequal. In particular, FIG. 9 takes two barrier columns 32 as an example, a cross-sectional width of at least one of the two barrier columns 32 along the second direction Y is greater than a cross-sectional width of white ink layer 21 along the second direction Y. Alternatively, a sum of cross-sectional widths of the two barrier columns 32, staggered along the first direction X, along the second direction Y is greater than the cross-sectional width of white ink layer 21 along the second direction Y. In FIG. 9, the cross-sectional width W1 of the barrier column 32 away from the second ink region 202 along the second direction Y is greater than the cross-sectional width W2 of the barrier column 32 near the second ink region 202 along the second direction Y, and the cross-sectional width W2 of the barrier column 32 near the second ink region 202 along the second direction Y is greater than the cross-sectional width W3 of white ink layer 21 along the second direction Y. FIG. 9, for example, only illustrates a size relationship of the cross-sectional width W1 of the barrier recess 31 along the second direction Y and the cross-sectional width W2 of white ink layer 21 along the second direction Y and would not limit a formation of the barrier recess 31 along the thickness direction of the display panel.

Furthermore, with reference to FIG. 10, heights of at least two barrier columns 32 along the thickness direction of the cover plate body 10 are unequal. In particular, FIG. 10 takes two barrier columns 32 for example, a depth of at least one of the two barrier columns 32 along the thickness direction of the cover plate body 10 is greater than the thickness of the ink portion 20. Alternatively, a sum of heights of the two barrier columns 32 along the thickness direction of the cover plate body 10 is greater than the thickness of the ink portion 20.

Figure 11:
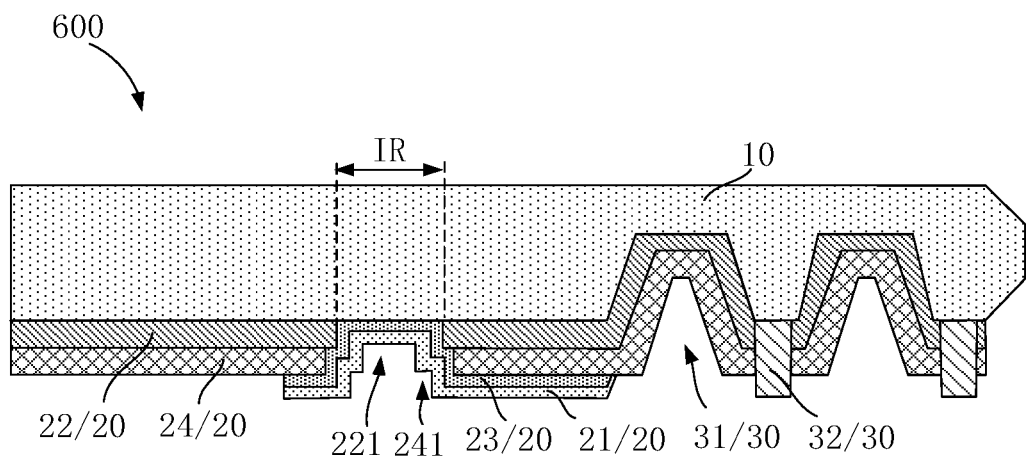
FIG. 11 is a tenth cross-sectional view of the cover plate in FIG. 1 along the AA' line.
Figure 12:
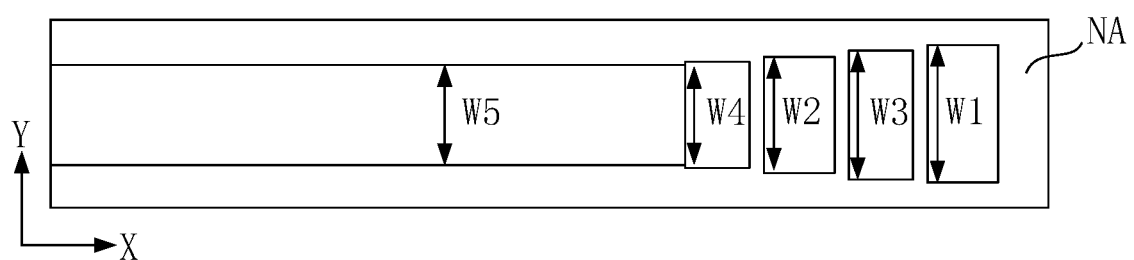
FIG. 12 is an eleventh cross-sectional view of the cover plate in FIG. 1 along the AA' line.
Figure 13:
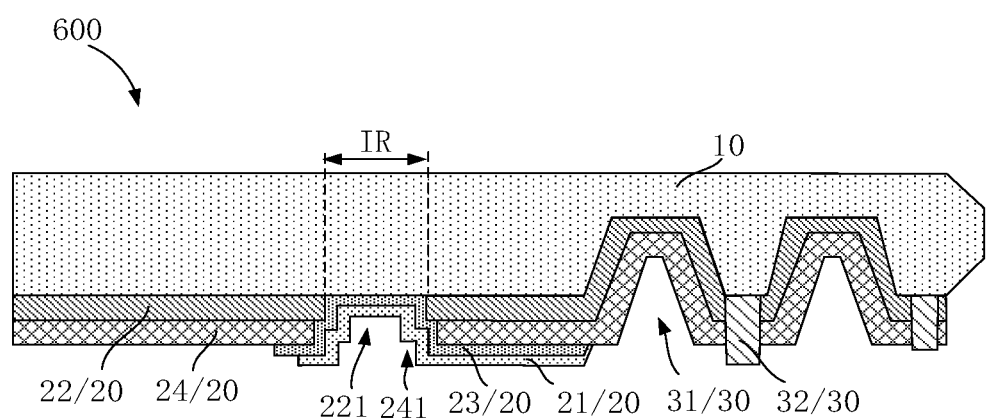
FIG. 13 is a twelfth cross-sectional view of the cover plate in FIG. 1 along the AA' line.

As a specific embodiment of the present application, with reference to FIG. 11 to FIG. 13, FIG. 11 is a tenth cross-sectional view of the cover plate in FIG. 1 along the AA' line; FIG. 12 is an eleventh cross-sectional view of the cover plate in FIG. 1 along the AA' line; and FIG. 13 is a twelfth cross-sectional view of the cover plate in FIG. 1 along the AA' line. With reference to FIG. 11, the embodiment of the present application provides a cover plate 600, and a difference of the cover plate 600 from the cover plate 400 is in that: the barrier portion 30 comprises the at least two barrier recesses 31 and at least two barrier columns 32, and the at least two barrier recesses 31 and at least two barrier columns 32 are disposed at intervals in the frame region NA and are located on a side of the infrared sensing hole sub-region IR away from the display region AA.

In the embodiment of the present application, the cover plate 500 further comprises: a cover plate body 10, an ink portion 20 and a barrier portion 30. The cover plate body 10 comprises a display region AA and a frame region NA. The frame region NA surrounds the display region AA, and an infrared sensing hole sub-region IR is disposed in the frame region. The ink portion 20 is disposed on the surface of the cover plate body 10 away from the light emitting side and is located in the frame region NA. The ink portion 20 comprises a white ink layer 21, and the white ink layer 21 covers the infrared sensing hole sub-region IR. The barrier portion 30 is disposed in the frame region NA and is located on a side of the infrared sensing hole sub-region IR away from the display region AA.

In the embodiment of the present application, the ink portion 20 further comprises a first black ink layer 22, a second black ink layer 24, and a translucent black ink layer 23. The first black ink layer 22 is disposed in the frame region NA and surrounds the infrared sensing hole sub-region IR. The translucent black ink layer 23 is disposed in the frame region NA and covers the infrared sensing hole sub-region IR. The white ink layer 21 covers the translucent black ink layer 23. The second black ink layer 24 is disposed on a side of the first black ink layer 22 away from the cover plate body 10. A first through hole 221 is defined in the first black ink layer 22 corresponding to the infrared sensing hole sub-region IR. A second through hole 241 is defined in the second black ink layer 24 corresponding to the infrared sensing hole sub-region IR. The translucent black ink layer 23 covers surfaces of the first through hole 221 and the second through hole 241 and partially covers the second black ink layer 24. In particular, the translucent black ink layer 23 covers bottom surfaces of the first through hole 221 and the second through hole 241, are disposed along two sidewalls of the first direction X, and extends from the sidewalls to partially cover the second black ink layer 24. A cross-sectional width of the first through hole 221 along the first direction X is greater than or equal to a cross-sectional width of the second through hole 241 along the first direction X.

In the embodiment of the present application, the infrared sensing hole sub-region IR, two barrier recesses 31 and two barrier columns 32 along the first direction X. Preferably, with reference to FIG. 11, cross-sectional widths of the two barrier recesses 31 and the two barrier columns 32 along the second direction Y are equal, and heights of the two barrier recesses 31 and the two barrier columns 32 along the thickness direction of the cover plate body 10 are equal. Such configuration advantages blocking the excessive white ink in the edge of the cover plate during silkscreen printing to prevent the white ink from overflowing to the edge of the cover plate, leading to change of refractive and reflection paths of light, and resulting in reflective light of the white ink more than that of a normal product to cause glowing of the edge of the cover plate.

Furthermore, with reference to FIG. 12, the cross-sectionals width of the at least two barrier recesses 31 along the second direction Y are unequal, and cross-sectional widths of at least two barrier columns 32 along the second direction Y are unequal. In particular, FIG. 12 takes two barrier recesses 31 and two barrier columns 32 for example, the cross-sectional width of at least one of the two barrier recesses 31 and two barrier columns 32 along the second direction Y is greater than the cross-sectional width of white ink layer 21 along the second direction Y. In FIG. 12, the cross-sectional width W1 of the barrier column 32 away from the second ink region 202 along the second direction Y is greater than a cross-sectional width W2 of the barrier column 32 near the second ink region 202 along the second direction Y, a cross-sectional width W3 of the barrier recess 31 away from the second ink region 202 along the second direction Y is greater than a cross-sectional width W4 of the barrier recess 31 near the second ink region 202 along the second direction Y, and a cross-sectional width W4 of the barrier recess 31 near the second ink region 202 along the second direction Y is greater than the cross-sectional width of white ink layer 21 along the second direction Y W5. FIG. 12, for example, only illustrates a size relationship of the cross-sectional width W1 of the barrier recess 31 along the second direction Y and the cross-sectional width W2 of white ink layer 21 along the second direction Y and would not limit a formation of the barrier recess 31 along the thickness direction of the display panel.

In particular, it also can be that a sum of cross-sectional widths of two barrier recesses 31, staggered along the first direction X, and two barrier columns 32, staggered along the first direction X, along the second direction Y is greater than the cross-sectional width of white ink layer 21 along the second direction Y.

Furthermore, with reference to FIG. 13, depths of the at least two barrier recesses 31 along the thickness direction of the cover plate body 10 are unequal, and heights of at least two barrier columns 32 along the thickness direction of the cover plate body 10 are unequal. In particular, FIG. 13 takes two barrier recesses 31 and two barrier columns 32 for example, a height of at least one of the two barrier recesses 31 and the two barrier columns 32 along the thickness direction of the cover plate body 10 is greater than a height of the ink portion 20 along the thickness direction of the cover plate body 10. FIG. 13 takes gradually increasing heights of the two barrier recesses 31 and the two barrier columns 32 along the thickness direction of the cover plate body 10 for example. In particular, it can also be that a sum of heights of the two barrier recesses 31 and the two barrier columns 32 along the thickness direction of the cover plate body 10 is greater than a height of the ink portion 20 along the thickness direction of the cover plate body 10.

The cover plate and the display screen provided by the embodiment of the present application are described in detail as above. In the specification, the specific examples are used to explain the principle and embodiment of the present application. The above description of the embodiments is only used to help understand the method of the present application and its spiritual idea. Meanwhile, for those skilled in the art, according to the present idea of invention, changes will be made in specific embodiment and application. In summary, the contents of this specification should not be construed as limiting the present application.

What is claimed:

1. A cover plate, comprising:
    a cover plate body comprising a display region and a frame region surrounding the display region, wherein an infrared sensing hole sub-region is disposed in the frame region;
    an ink portion disposed on a surface of the cover plate body, located in the frame region, and comprising a white ink layer covering the infrared sensing hole sub-region; and
    a barrier portion disposed in the frame region and located on a side of the infrared sensing hole sub-region away from the display region;
    wherein a boundary of the white ink layer away from the display region does not extend beyond a boundary of the barrier portion away from display region.

2. The cover plate according to claim 1, wherein the ink portion further comprises a first black ink layer and a translucent black ink layer, and the first black ink layer is disposed in the frame region and surrounds the infrared sensing hole sub-region; and
    the translucent black ink layer is disposed in the frame region and covers the infrared sensing hole sub-region, and the white ink layer covers the translucent black ink layer.

3. The cover plate according to claim 2, wherein the ink portion further comprises a second black ink layer disposed on a side of the first black ink layer away from the cover plate body;
    a first through hole is defined in the first black ink layer corresponding to the infrared sensing hole sub-region;
    a second through hole is defined in the second black ink layer corresponding to the infrared sensing hole sub-region, the translucent black ink layer covers surfaces of the first through hole and the second through hole and partially covers the second black ink layer; and
    a cross-sectional width of the first through hole along a first direction is greater than or equal to a cross-sectional width of the second through hole along the first direction.

4. The cover plate according to claim 1, wherein the barrier portion comprises a barrier recess disposed in the frame region and located on a side of the infrared sensing hole sub-region away from the display region.

5. The cover plate according to claim 4, wherein the infrared sensing hole sub-region and the barrier recess are arranged along a first direction, a cross-sectional width of the barrier recess along a second direction is greater than a cross-sectional width of the white ink layer along the second direction, and the first direction is perpendicular to the second direction.

6. The cover plate according to claim 5, wherein a depth of the barrier recess is greater than or equal to a thickness of the ink portion.

7. The cover plate according to claim 5, wherein a height of the barrier column is greater than or equal to a thickness of the ink portion.

8. The cover plate according to claim 5, wherein material of the barrier column is the same as material of the first black ink layer.

9. The cover plate according to claim 1, wherein the barrier portion comprises a barrier column disposed in the frame region and located on a side of the infrared sensing hole sub-region away from the display region.

10. The cover plate according to claim 9, wherein the infrared sensing hole sub-region and the barrier column are arranged along a first direction, a cross-sectional width of the barrier column along a second direction is greater than a cross-sectional width of the white ink layer along the second direction, and the first direction is perpendicular to the second direction.

11. The cover plate according to claim 1, wherein the barrier portion comprises a barrier recess and a barrier column, and the barrier column is disposed adjacent to the barrier recess.

12. The cover plate according to claim 11, wherein the infrared sensing hole sub-region, the barrier recess, and the barrier column are arranged along a first direction, a cross-sectional width of at least one of the barrier recess and the barrier column along a second direction is greater than a cross-sectional width of the white ink layer along the second direction, and the first direction is perpendicular to the second direction.

13. The cover plate according to claim 12, wherein a depth of the barrier recess is greater than or equal to a thickness of the ink portion; or
a height of the barrier column is greater than or equal to a thickness of the ink portion.

14. The cover plate according to claim 12, wherein the barrier portion comprises at least two barrier recesses, and/or, the barrier portion comprises at least two barrier columns.

15. The cover plate according to claim 14, wherein cross-sectional widths of the at least two barrier recesses along the second direction are unequal; and/or cross-sectional widths of at least two of the barrier columns along the second direction are unequal.

16. The cover plate according to claim 14, wherein heights of the at least two barrier recesses along a thickness direction of the cover plate body are unequal; and/or
heights of at least two of the barrier columns along the cover plate body thickness direction are unequal.

17. A display screen, comprising a cover plate and a display panel, wherein the cover plate is bonded to a light exiting surface of the display panel and comprises:
a cover plate body comprising a display region and a frame region, the frame region surrounds the display region, and an infrared sensing hole sub-region is defined in the frame region;
an ink portion disposed on a surface of the cover plate body, located in the frame region, and comprising a white ink layer covering the infrared sensing hole sub-region; and
a barrier portion disposed in the frame region and located on a side of the infrared sensing hole sub-region away from the display region;
wherein a boundary of the white ink layer away from the display region does not extend beyond a boundary of the barrier portion away from display region.

18. The display screen according to claim 17, wherein the ink portion further comprises a first black ink layer and a translucent black ink layer, and the first black ink layer is disposed in the frame region and surrounds the infrared sensing hole sub-region; and
the translucent black ink layer is disposed in the frame region and covers the infrared sensing hole sub-region, and the white ink layer covers the translucent black ink layer.

19. The display screen according to claim 18, wherein the barrier portion comprises a barrier recess or a barrier column, and the barrier portion is disposed in the frame region and is located on a side of the infrared sensing hole sub-region away from the display region.

20. The display screen according to claim 19, wherein the infrared sensing hole sub-region and the barrier portion are arranged along a first direction, a cross-sectional width of the barrier portion along a second direction is greater than a cross-sectional width of the white ink layer along the second direction, and the first direction is perpendicular to the second direction.

* * * * *